(12) United States Patent  
Broennimann et al.

(10) Patent No.: US 7,514,688 B2
(45) Date of Patent: Apr. 7, 2009

(54) PHOTON COUNTING IMAGING DEVICE

(75) Inventors: Christian Broennimann, Ehrendingen (CH); Bernd Schmitt, Zurich (CH)

(73) Assignee: Paul Scherrer Institut, Villigen PSI, Schweiz ( * ) Notice: Subject to any disclaimer, the term of this patent is extended or adjusted under 35 U.S.C. 154(b) by 616 days.

(21) Appl. No.: 10/539,837

(22) PCT Filed: Aug. 11, 2003

(86) PCT No.: PCT/EP03/08886

§ 371 (c)(1),
(2), (4) Date: Jun. 17, 2005

(87) PCT Pub. No.: WO2004/064168

PCT Pub. Date: Jul. 29, 2004

(65) Prior Publication Data

US 2006/0071170 A1   Apr. 6, 2006

(30) Foreign Application Priority Data

Jan. 10, 2003 (EP) ................. 03000358
Jan. 10, 2003 (EP) ................. 03000359
Jan. 21, 2003 (EP) ................. 03001143

(51) Int. Cl.
G01T 1/20 (2006.01)
(52) U.S. Cl. ............................................ 250/370.11
(58) Field of Classification Search ............ 250/370.11
See application file for complete search history.

(56) References Cited

U.S. PATENT DOCUMENTS

| 4,700,076 | A |   | 10/1987 | Dorman et al. |
| 5,107,103 | A | * | 4/1992 | Gruss et al. ............ 250/208.3 |
| 5,236,871 | A | * | 8/1993 | Fossum et al. ................ 438/59 |
| 5,574,284 | A |   | 11/1996 | Farr |
| 5,608,775 | A | * | 3/1997 | Hassler et al. ............. 378/98.8 |
| 5,665,959 | A |   | 9/1997 | Fossum et al. |
| 5,856,666 | A | * | 1/1999 | Moulsley .................. 250/208.1 |
| 5,909,026 | A | * | 6/1999 | Zhou et al. ................ 250/208.1 |
| 5,962,856 | A | * | 10/1999 | Zhao et al. ............. 250/370.09 |
| 5,970,115 | A | * | 10/1999 | Colbeth et al. ................ 378/62 |

FOREIGN PATENT DOCUMENTS

| GB |   | 2294540 | A | * | 5/1996 |
| WO |   | WO 00/17670 |   |   | 3/2000 |
| WO |   | WO 02/058104 |   |   | 7/2002 |

* cited by examiner

Primary Examiner—David P Porta
Assistant Examiner—Mark R Gaworecki
(74) Attorney, Agent, or Firm—Laurence A. Greenberg; Werner H. Stemer; Ralph E. Locher

(57) ABSTRACT

The invention is directed to increasing the time resolution capabilities of a photon counting imaging device. This is achieved by a photon-counting imaging device for single x-ray counting, including: a layer of photosensitive material; an N×M array of photodetector diodes arranged in the layer of the photosensitive material; an N×M array of readout unit cells including an high gain, low noise amplifying elements, one readout unit cell for each photodetector diode; the readout unit cells being controlled by a data processing elements; each readout unit cell comprising an internal data processing elements allowing to assign an output signal representing an amplifyied signal of the electron hole pairs generated by an incident photon or a predetermined number of incident photons in the respective photodetector diode to a preselectable region of interest; and the assignment of the output signal is accompanied by a time stamp generated by a clock means.

26 Claims, 5 Drawing Sheets

PHOTON COUNTING IMAGING DEVICE

BACKGROUND OF THE INVENTION

Figure 1:
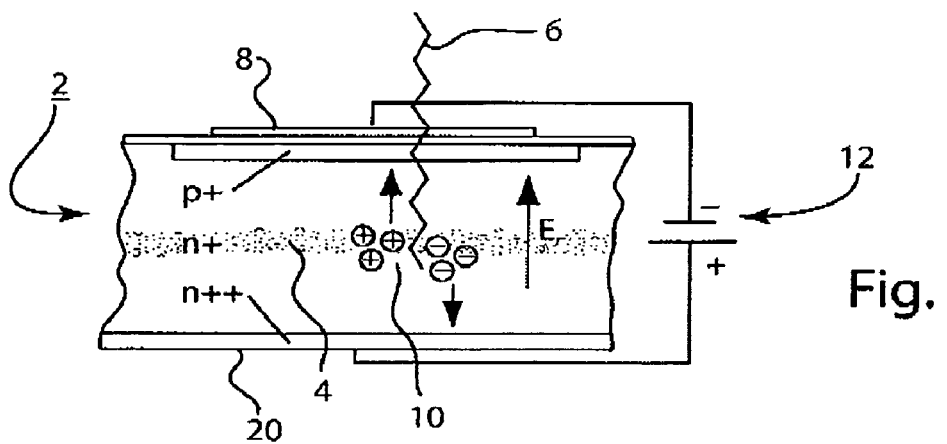

The invention relates to a photon-counting imaging device for single x-ray counting. Further, the invention relates to a photon-counting imaging device with a fast region of interest data evaluation.

X-ray diffraction patterns are useful in the analysis of molecular structures, such as protein and virus molecules, and require photon counting imaging devices. Especially, protein and virus crystallography imposes stringent requirements on x-ray detectors, particularly where the x-ray source is high flux synchrotron radiation that enables an experiment to be done rapidly. Furthermore, an important and developing field is time-resolved diffraction experiments using synchrotron radiation, such as crystallography and/or powder diffraction analysis. Monitoring a time-dependent reaction in a sample, i.e. a crystal or a powder, can elucidate the time-dependent crystal/molecular changes that occur in a chemical reaction as well. High time resolution speed is often critical in such monitoring.

In the literature, a high speed crystallography detector is disclosed by the U.S. Pat. No. 5,629,524 and a solid-state image sensor with focal-plane digital photon-counting pixel array is disclosed by the U.S. Pat. No. 5,665,959. The latter patent describes and illustrates a focal-plane array comprising an array of N×N photodetector diodes connected to a digital photon-counting means for ultrlow level image light detection and digital image pixel readout means for each pixel comprising separate CMOS buffer amplifiers that exhibit the following characteristics: low power (<1 µW per pixel average), high photoelectron charge to voltage conversion gain ($\approx 1$ mV/e$^-$), low noise (<1 e$^-$), small cell pitch (<30 µm), easy scalability (to 10 µm), self biasing capability, sufficient gain uniformity (~10%) for multiple event discrimination, and bias current programmability. Any incident photon during the sampling period generates a photoelectron at the output of the detector diode connected to the input of the amplifier. That photoelectron changes the potential of the buffer amplifier's input capacitance. This change in potential causes the high-gain buffer amplifier to present a sufficiently large voltage change at the output of the amplifier to be above the system noise level.

The drawback of this disclosure remains substantially in the design of this photon counting device that is dedicated to detect with brilliant sensitivity a single photon having its energy in the range of the visible light (several eV). This device can therefore be used for infra-red binoculars or for space-based telescopes and spectrometers. The electronic circuitry is therefore that sensitive that an incident photon is amplified in order to saturate the buffer of the amplifier. An additional incident photon occurring in the same photodetector diode within the same sampling period as the first incident photon therefore can not be detected unless the buffer is reset. This photon detecting device is therefore completely useless for the above-mentioned purposes of x-ray photon detection.

Nevertheless, the general design of the semiconductor chip is preferably a hybrid using a separate semiconductor material for two chips selected to be optimum for the photovoltaic type of detector diodes in one and the buffer amplifier and multiplexing circuit in the other chip bump bonded to the first to make connections between the output interface of the detector diodes on one chip and the input interface of the buffer amplifier on the other chip with the photodetector diodes buffer amplifier in one semiconductor chip and the multiplexing means and digital counters on the second semiconductor chip bump bonded to the first. As disclosed in the U.S. Pat. No. 5,629,524 a suitable material for the electrical bump connection is Indium. But even this device for x-ray photon detection can not be used in high dynamic investigation since the electronic circuitry is limited due to the switching dead time that is required to integrate the charge of the photo electrons subsequently to a chain of capacitors (referred to as a M-bit shift register) which have to be read out afterwards serially due to its chain-like arrangement. It could be easily understood that the performance of this circuitry is limited to its switching intervals for charging and scanning the capacitors.

Another prior art document worth to be mentioned is the U.S. Pat. No. 5,812,191 disclosing a semiconductor high-energy radiation imaging device having an array of pixel cells including a semiconductor detector substrate and a semiconductor readout substrate. The semiconductor detector substrate includes an array of pixel detector cells, each of which directly generates charge in response to incident high-energy radiation. The semiconductor readout substrate includes an array of individually addressable pixel circuits, each of which is connected to a corresponding pixel detector cell to form a pixel cell. Each pixel circuit includes charge accumulation circuitry for accumulating charge directly resulting from high-energy radiation incident on a corresponding pixel detector cell, readout circuitry for reading the accumulated charge, and reset circuitry for resetting the charge accumulation circuitry. Unfortunately, the accumulated charge is stored as analog data using a circuitry having two transistors, one transistor acting as the charge store while the other acts as a readout switch responsive to an enable signal. This design restricts the circuitry to allow individual addressing each pixel but only discharge the accumulated analog charge to an output line when activated by its respective enable signal. This circuitry does not enable any further manipulation of the pixel detector cells.

Another imaging device for imaging radiation according to the international patent application WO 98/16853 includes an image cell array. The image cell array includes an array of detectors cells which generates charge in response to instant radiation and an array of image cell circuits. Each image cell circuit is associated with a respective detector cell. The image cell circuit includes counting circuitry for counting plural radiation hits incident on an associated detector cell. Preferably, the image cell circuit includes threshold circuitry connected to receive signals generated in the associated detector cell and having values dependent on the incident radiation energy. The counting circuitry is then connected to the threshold circuitry for counting only radiation hits within a predetermined energy range or ranges. The electronic readout circuitry is designed to comprise a loadable shift register storing the data serially in a row that means the input data is the data from the previous pixel and the output delivers the actual data to the next pixel. The main drawback of this arrangement consists in the susceptibility to a failure of a complete row of the detector array if only one the readout circuitry in a row fails.

Furthermore, using x-ray diffraction for the analysis of the crystallographic structure of a sample a fast and reliable measurement procedure requires a comparably large detector array for covering a sufficient large spatial area. It is apparent from the required electronic equipment that an increasing number of detector arrays is followed by an increasing number of electronic equipment and/or a prolonged evaluation procedure.

Resuming the prior art documents it will be apparent that none of the documents disclose a photon counting imaging device that allow high readout performance und superior reliability of operation.

Therefore, it is the aim of the invention to increase the performance and the reliability of a complete photon-counting imaging device.

SUMMARY OF THE INVENTION

This aim is achieved according to the invention by a photon-counting imaging device for single x-ray counting comprising:
- a) a layer of photosensitive material;
- b) a source of bias potential;
- c) a source of threshold voltage supply;
- d) an N×M array of photodetector diodes arranged in said layer of photosensitive material; each of said photodetector diodes having a bias potential interface and a diode output interface, said bias potential interface of each photodetector diode being connected to said bias potential;
- e) an N×M array of high gain, low noise readout unit cells, one readout unit cell for each photodetector diode;
- f) each readout unit cell comprising an input interface connected to said diode output interface, a high-gain voltage amplifying means comprising a comparator unit, a digital counter unit, comprising a digital counter, and a digital counter output interface connected in series, each digital counter unit counting an output signal of the comparator unit; said output signal is proportional to a number of electron/hole pairs generated by a photon in the respective photodetector diode,
- g) a multiplexing means comprising a row select and a column select allowing to access each of the readout cell units, i.e. to read out the digital data as actually stored in the digital counter to the digital counter output interface;
- h) each digital counter output interface connected to an output bus
- i) said output bus being connected to a data processing means controlling the multiplexing means.

According the these measures, a photon counting imaging device is created having an architecture of the readout circuitry that allows to be tolerant with respect to a local defect of a detector diode and/or readout unit cell and that allow to control and redesign the program and/or the status of each detector diode and/or readout unit cell.

An advantageous architecture comprises the diode output interface of the photodetector diodes and the input interface of the readout unit cell to be connected to each other by bump bonding, preferably using indium bumps for the bump bonding. This measure facilitates the manufacturing of a photodetector diode and readout cell unit assembly at considerably low temperatures. Using the indium bumps leads in detail to soldering temperatures lower than 100° C. that not jeopardizes the fine structures of the complete assembly.

To allow control and access to each of the readout unit cells and/or detector diodes the data processing means are provided being connected via the multiplexer means to said array of readout unit cells. Therefore, two independent shift register of the multiplexing means can access the circuitry of one pixel by electing the respective pixel via row and column select. To interact with the data processing means each readout unit cell comprises an AND-gate having as inputs the row select and the column select of the multiplexing means. If both inputs are high the AND-gate set high and access to the readout unit cell is established.

Another favourable feature in developing the afore-mentioned invention can provide said data processing means controlling a enable/disenable switch being comprised in said high gain voltage amplifying means, preferably in the comparator unit. Therefore, the data processing means control said enable/disenable switch in order to trigger temporarily the gate of an amplifying means being comprised in said high gain voltage amplifying means.

In order to globally or individually adjust a proper sensisitivity of all or only of an individual detector diode said source of threshold voltage supply to said high-gain voltage amplifying means comprises an adjustable source of threshold voltage correction supply, both being controlled by the data processing means via the multiplexer means.

A consequential measure provides the data processing means to control via the multiplexing means one or more of the following issues:
- a) programming of the readout unit cell via a port;
- b) readout of the data in the readout unit cell via a port;
- c) calibration of the readout unit cell, preferably the high gain voltage amplifier means, via a port; and
- d) analyzing the analog signal in the high gain voltage amplifier means for the purpose of diagnosis via a port.

This measure now in detail explains the advantages derivable from the afore-mentioned multiplexing means that allow the direct access to each readout unit cell. The calibration in the regard is considered to be able to calibrate the bias of each photodetector diode. Another calibration can be achieve by the afore-mentioned adjustment of the threshold voltage by the threshold voltage correction supply. For evaluating the status of the photodetector diode and/or the analog part of the readout unit cell circuitry in detail the analysis of the analog signal processed with the high gain voltage amplifier means is very helpful and could only be achieved by the ability to address a distinct detector pixel using two independent row and column address registers of the multiplexing means.

For constructing a photon-counting imaging device detecting the photon radiation over a comparably large focal or flat area a suitable architecture can provide said N×M array of photodetector diodes, said N×M array of said readout unit cells being arranged on a first substantially flat support plate for building a sensor module, and a sensor module control board being arranged on a second substantially flat support plate; said first substantially flat support plate and said second substantially flat support plate being arranged under an angle to each other. A suitable angle may reside within a range of 30 to 120°, preferably 45 to 100°. This measure allows to construct a plane or curved detector surface area made from a number of sensor modules having stretched out on the opposite side of its detector surface the sensor module control board comprising at least partial the required readout electronic equipment, i.e. the data processing means or at least part of them.

For forming a large solid-state photon-counting imaging device a number of the afore-mentioned sensor modules being arranged in a substantially flat or curved V×W array wherein V and W are integer numbers at least one of them larger than one.

Again, resuming the prior art documents it will be apparent that none of the documents disclose a photon counting imaging device that allow high readout performance und superior reliability of operation having a very fast and immediate control for the readout electronics and the photodetector diodes.

Therefore, it is also the aim of the invention to increase the performance and the reliability of a complete photon-counting imaging device.

This aim is achieved according to the invention by a photon-counting imaging device for single x-ray counting comprising:

a) a layer of photosensitive material;
b) a source of bias potential;
c) a source of threshold voltage supply;
d) an N×M array of photodetector diodes arranged in said layer of photosensitive material; each of said photodetector diodes having a bias potential interface and a diode output interface, said bias potential interface of each photodetector diode being connected to said bias potential;
e) an N×M array of high gain, low noise readout unit cells, one readout unit cell for each photodetector diode being controlled by a data processing means; and
f) the array of photodetector diodes is designed as a microstrip detector having N=1 columns and M>1, preferably $10 < M < 10^5$, rows.

This photon counting imaging device allows a very fast and efficient readout procedure and facilitates to arrange a larger number of photo-detector diodes orientated vertically in length to build a convex array of x-ray detection diodes. With a stable x-ray beam, i.e. taken from a synchroton, and the feasibility of turning the sample stepwise, the complete crystalline structure of the sample can be investigated in a comparably short time.

The dimension are in an advantageous way chosen to comprise said rows having a width of about 5 to 50 μm, preferably about 10 to 20 μm, a length of about 0.5 to 50 mm, preferably 5 to 10 mm, and a of pitch of 10 to 100 μm, preferably 25 to 75 μm.

A proper design of the readout unit cell provides a readout unit cell having an input interface connected to said diode output interface, a high-gain voltage amplifying means comprising a comparator unit, a digital counter unit, comprising a digital counter, and a digital counter output interface connected in series, each digital counter unit counting an output signal of the comparator unit; said output signal is proportional to a number of electron hole pairs generated by a photon in the respective photodetector diode.

In order to globally or individually adjust a proper sensitivity of all or only of an individual detector diode said source of threshold voltage supply to said high-gain voltage amplifying means comprises an adjustable source of threshold voltage correction supply, both being controlled by the data processing means via the multiplexer means.

In order to increase the position resolution of an incident photon the data processing means may provide means for enhancing the position resolution of an incident photon; said means for enhancing the position resolution comprising a comparator means comparing the signals of two adjacent photodetector diodes. By the comparison of the signal from the two adjacent photodetector diode a photon can be assigned to an virtual intermediate photodetector diode in case the charge of the electron hole pairs generated in the twilight zone between two adjacent photodetector diodes can be observed in partially in two adjacent photodetector diodes.

In order to take advantage of the afore-mentioned feature with respect to avoiding double counting the data processing means allow to determine an average amplitude for the gain of the electron hole pairs generated by an incident photon and to set a threshold voltage corresponding to less than half of the average amplitude; said data processing means evaluate coincident output signals in adjacent readout unit cells in order to disenable the counting in the adjacent readout unit cells having coincidently delivered the lower output signal(s).

Another innovative feature with respect to the resolution of the device may provide the data processing means allowing to determine an average amplitude for the gain of the electron hole pairs generated by an incident x-ray photon and to set a threshold voltage corresponding to less than half of the average amplitude; the data processing means may generate a virtual intermediate photodetector diode between two adjacent photodetector diodes; and an incident photon is assigned to said virtual intermediate photodetector diode in case the output signals in two readout unit cells assigned to adjacent photodetector diodes exceed said threshold voltage ($V_{Thresh}$) coincidently.

A consequential measure provides the data processing means to control via the multiplexing means one or more of the following issues:

a) programming of the readout unit cell via a port;
b) readout of the data in the readout unit cell via a port;
c) calibration of the readout unit cell, preferably the high gain voltage amplifier means, via a port; and
d) analyzing the analog signal in the high gain voltage amplifier means for the purpose of diagnosis via a port.

This measure now in detail explains the advantages derivable from the afore-mentioned multiplexing means that allow the direct access to each readout unit cell. The calibration in the regard is considered to be able to calibrate the bias of each photodetector diode. Another calibration can be achieve by the afore-mentioned adjustment of the threshold voltage by the threshold voltage correction supply. For evaluating the status of the photodetector diode and/or the analog part of the readout unit cell circuitry in detail the analysis of the analog signal processed with the high gain voltage amplifier means is very helpful and could only be achieved by the ability to address a distinct detector pixel using two independent shift registers of the multiplexing means.

For constructing a photon-counting imaging device detecting the photon radiation over a comparably large focal or flat area a suitable architecture can provide said N×M array of photodetector diodes, said N×M array of said readout unit cells being arranged on a first substantially flat support plate for building a sensor module, and a sensor module control board being arranged on a second substantially flat support plate; said first substantially flat support plate and said second substantially flat support plate being arranged under an angle to each other. A suitable angle may reside within a range of 20 to 180°, preferably 45 to 100°. This measure allows to construct a plane or curved detector surface area made from a number of sensor modules having stretched out on the opposite side of its detector surface the sensor module control board comprising at least partial the required readout electronic equipment, i.e. the data processing means or at least part of them.

For forming a large solid-state photon-counting imaging device a number of the afore-mentioned sensor modules being arranged in a substantially flat or curved V×W array wherein V and W are integer numbers at least one of them larger than one.

Again, resuming the prior art documents it will be also apparent that none of the documents disclose a photon counting imaging device that allow high time resolution capabilities in order to detect the time resoluted occurrence of a photon or a predetermined number of photons in a distinct cell or region in the photodetector diode.

Therefore, it is also the aim of the invention to increase the time resolution capabilities of a photon counting imaging device.

This aim is achieved according to the invention by a photon-counting imaging device for single x-ray counting comprising:

a) a layer of photosensitive material;
b) an N×M array of photodetector diodes arranged in said layer of said photosensitive material;
c) an N×M array of readout unit cells comprising an high gain, low noise amplifying means, one readout-unit cell for each photodetector diode; the readout unit cells being controlled by a data processing means;
d) each readout unit cell comprising an internal data processing means allowing to assign an output signal representing an amplifyied signal of the electron hole pairs generated by an incident photon or a predetermined number of incident photons in the respective photodetector diode to a preselectable region of interest; and
e) said assignment of the output signal is accompanied by a time stamp generated by a clock means.

Due to this measure beside the normal operation of the photon counting imaging device the output signal generated by the amplifying means can be treated separately with respect to the occurrence of the photon hitting the respective photodetector diode. For that reason, the time resolution at least for this preselected region of interest, that could consist of one distinct photodetector diode only or of a number of adjacent photodetector diodes, is enhanced as far as the clock means allow this resolution with an appropriate frequency. Hereby, the clock means can be realized as a counter being pulsed with a specific frequency; for example, a pulse frequency of 100 MHz yields to a possible time resolution of 10 ns. The time stamp therefore is derived by the actual standings of the counter when a photon hits a photodetector diode being part of a preselected region of interest and the simultaneous output signal occurrs.

A proper design of the photon-counting imaging device may understand each readout unit cell to comprise an input interface connected to said diode output interface, a high-gain voltage amplifying means comprising a comparator unit, a digital counter unit, comprising a digital counter, and a digital counter output interface connected in series, each digital counter unit counting the output signal of the comparator unit; said output signal is additionally directed to a region of interest unit; said region of interest unit being part of the readout unit cell or being part of the external data processing means. The advantage of a region of interest unit being part of the readout unit cell consist in the processing of the region of interest data on chip and therefore only the output of the readout unit cells being part of the predeterimed regions of interest have to observed.

Again, in order to design the photon-counting imaging device in an consequential and easy manner, it may comprise at least one predeterminable region of interest, whereby a preselectable number of selectable photodetector diodes represent this region of interest;

the output signal in each elected corresponding readout unit cell being processed to the respective region of interest unit causing the output interface corresponding to the region of interest hit by an incident photon to set a region of interest hit signal;

said region of interest hit signal is aligned by the time stamp originated by an external or an internal clock means. Additionally, it seems to be most suitable to have the data processing means providing a means for storing either the time stamp or an information comprising the time stamp and the corresponding regions of interest which was hit by an incident photon originally causing the output signal. The first alternative takes it as granted that a specific part of the means for storing offer a distinct volume dedicated to store the time stamps for a distinct region of interest only. The second alternative requires a bit more available storage space because each data entry comprises the time stamp and the region of interest information.

For region of interest in which x-rays are hitting the detector diode too frequently to store the arrival time (which is represented by the time stamp) of each photon separately, additional electronics can be implemented in each readout unit cell to generate the region of interest hit signal only after a programmable number of photons have hit the region of interest channel. Therefore, it may be appropriate to design the region of interest unit as to comprise a counter means for which a region of interest hit signal set threshold is determinable.

In order to achieve a sufficient time resolution the counting of the clock means should be initiated with the initial start of an experiment or a sample period. Therefore, it is useful when the external or the internal clock means can be reset and operates with a frequency in the range of 10 to 500 MHz, preferably about 100 MHz. The latter frequency yields to a time resolution of about 10 ns, which allows conveniently to observe even very fast changements in the crystalline structure of a probe.

For some of the possible investigations with the photon-counting imaging device, it may be very interesting to change the defined regions of interest during a measurement cycle, may be due to an assumed change of the crystalline structure or for other reasons. Therefore, the device is designed to allow the definition of a number of at least two regions of interest are provided, each of the at least two regions of interest having a programmable time-related validity. This may have in detail the meaning that the region of interest migrate as a function of the time. Therefore, at least an initial region of interest have to be predetermined and a time related function for the migration of the region of interest. Therefore, also this example is to be understood when the claim language mentions that at least two regions of interest are provided.

Examples of the invention are described below in accordance with the drawings which depict:

BRIEF DESCRIPTIONS OF THE SEVERAL VIEWS OF THE DRAWINGS

Figure 2:
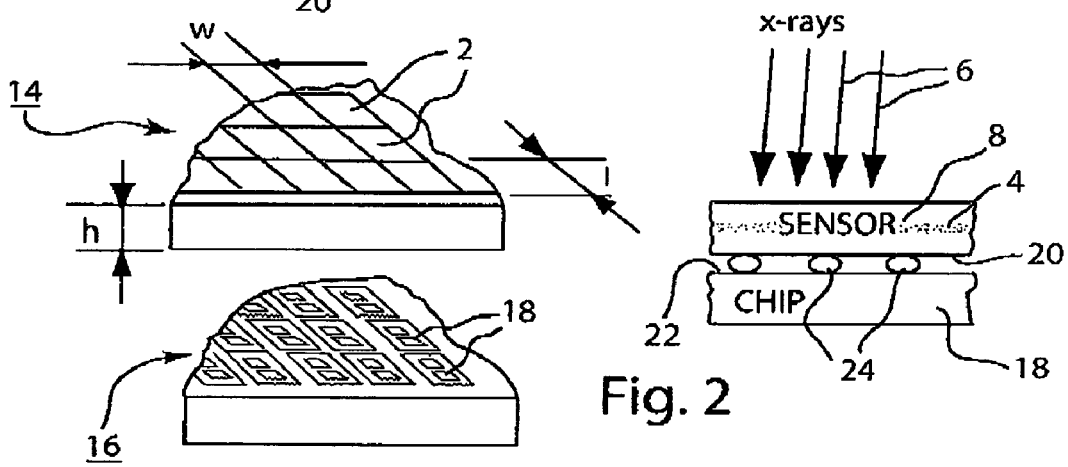
Figure 3:
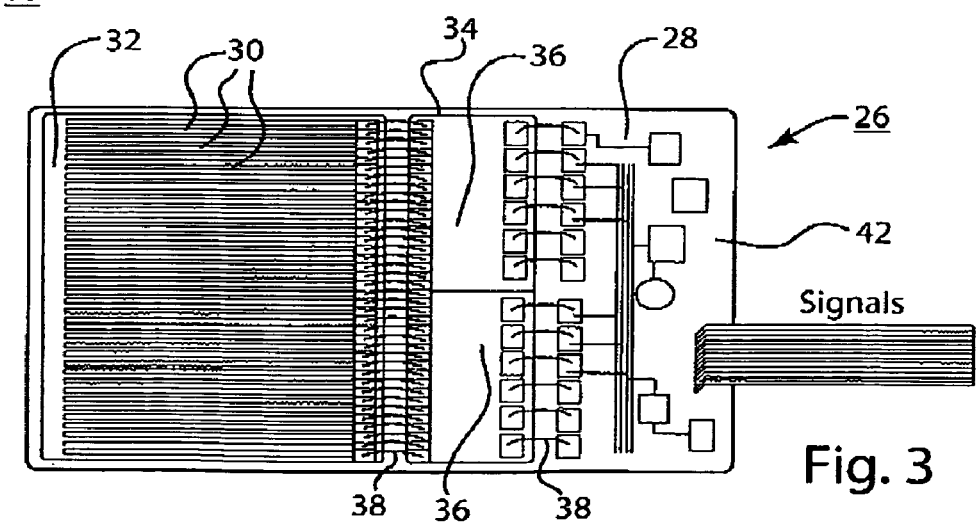
Figure 4:
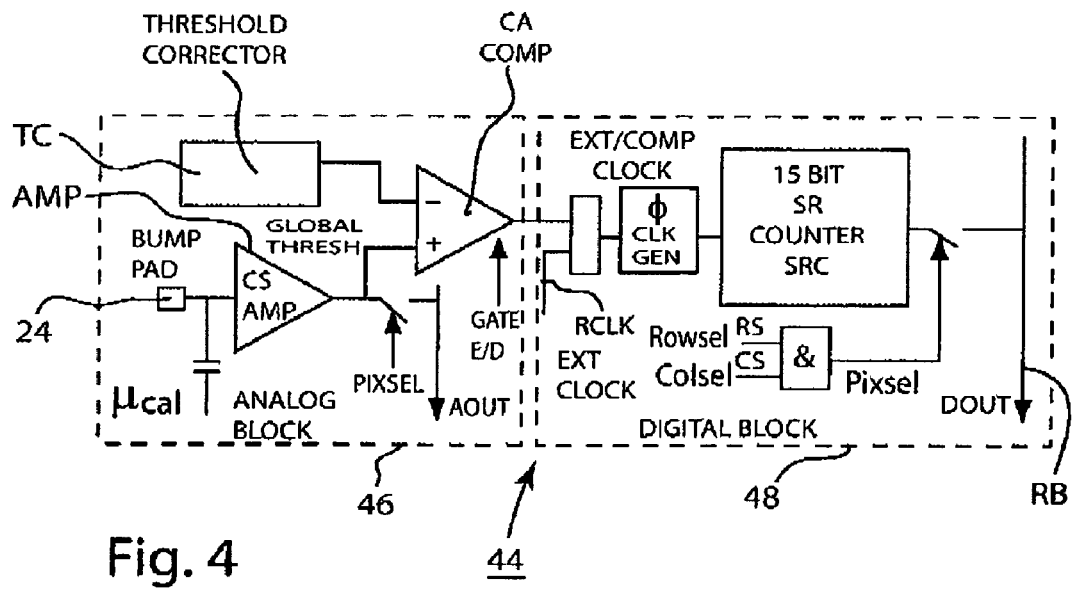
Figure 5:
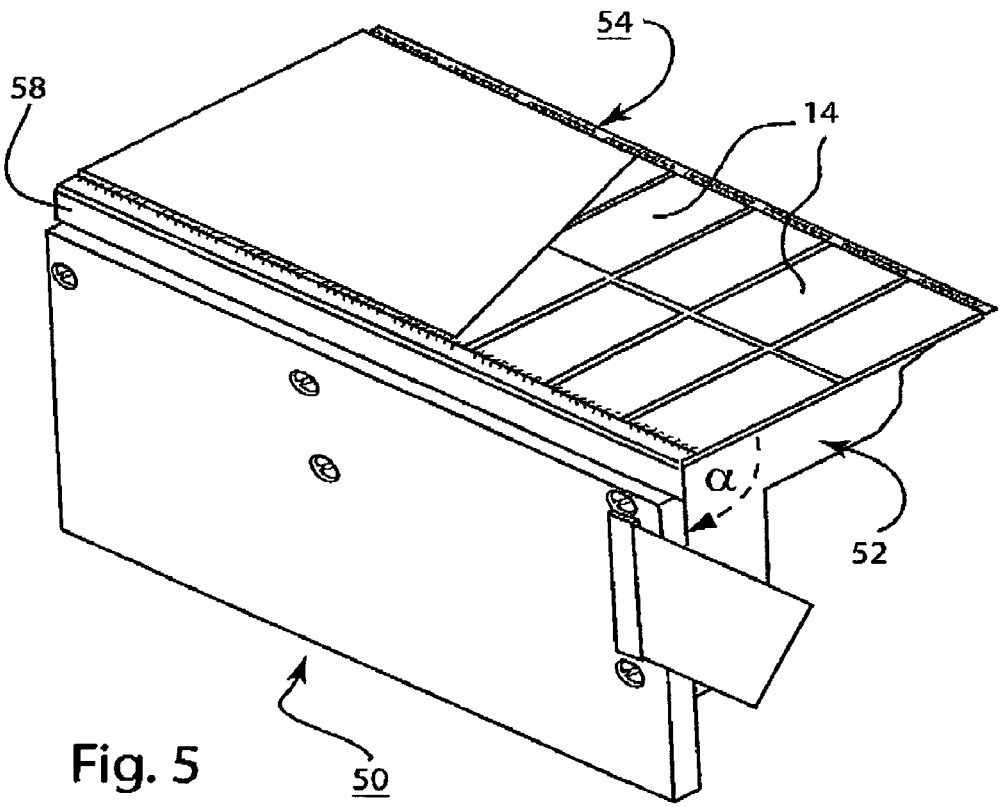
Figure 6:
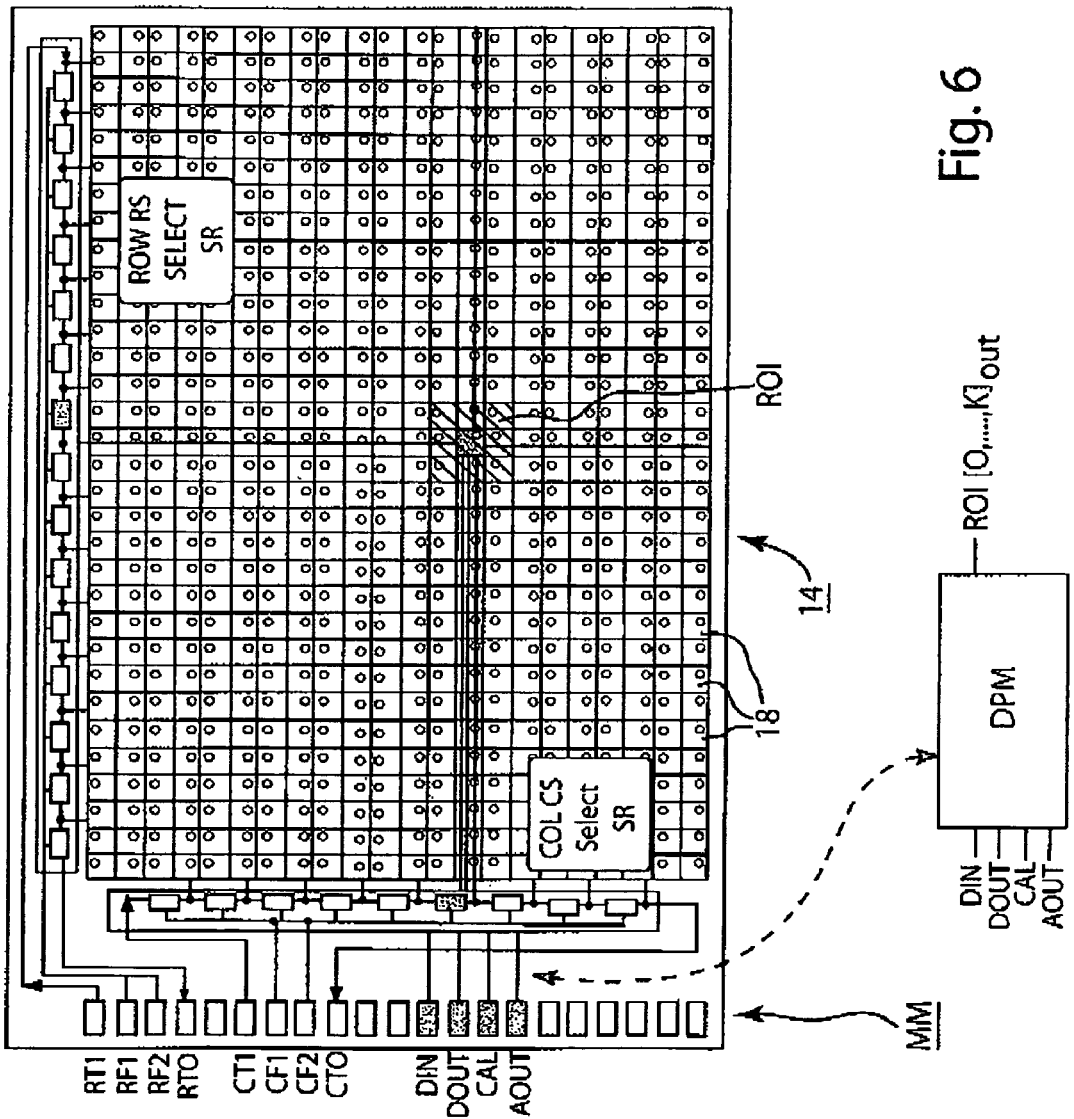
Figure 7:
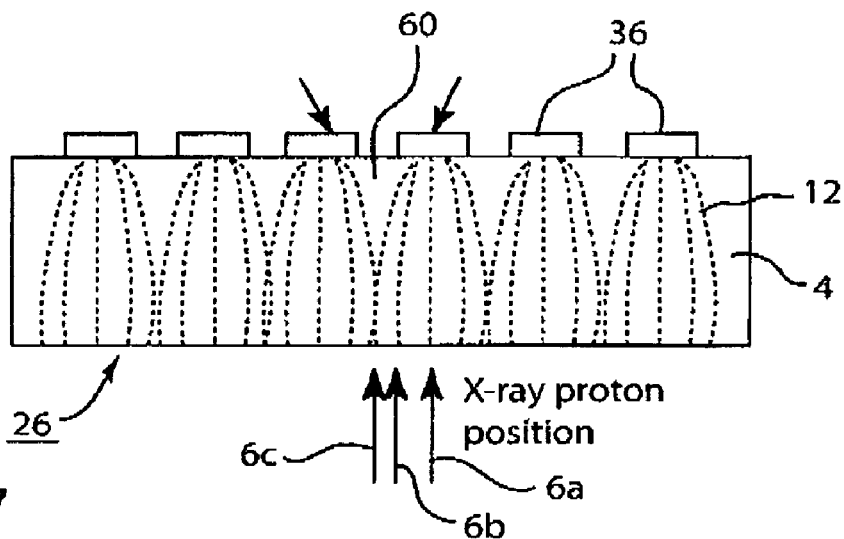
Figure 8A:
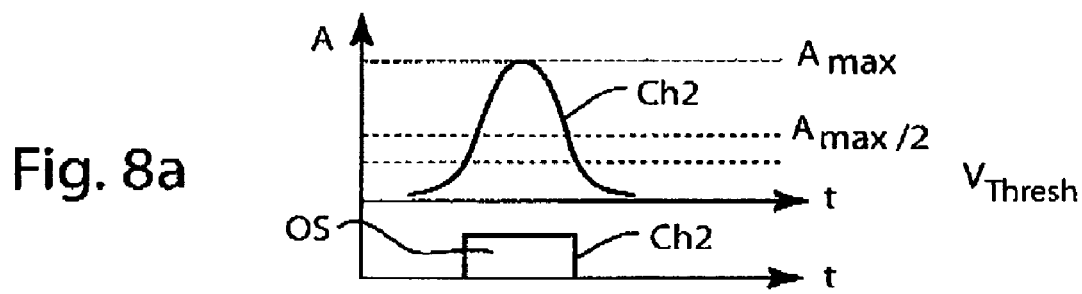
Figure 8B:
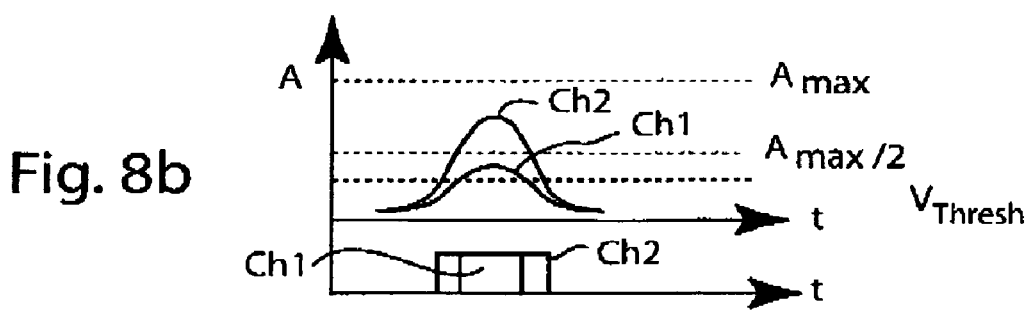
Figure 8C:
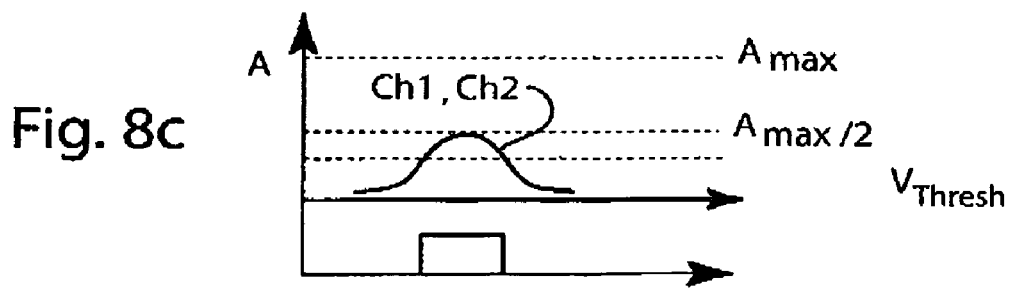
Figure 9:
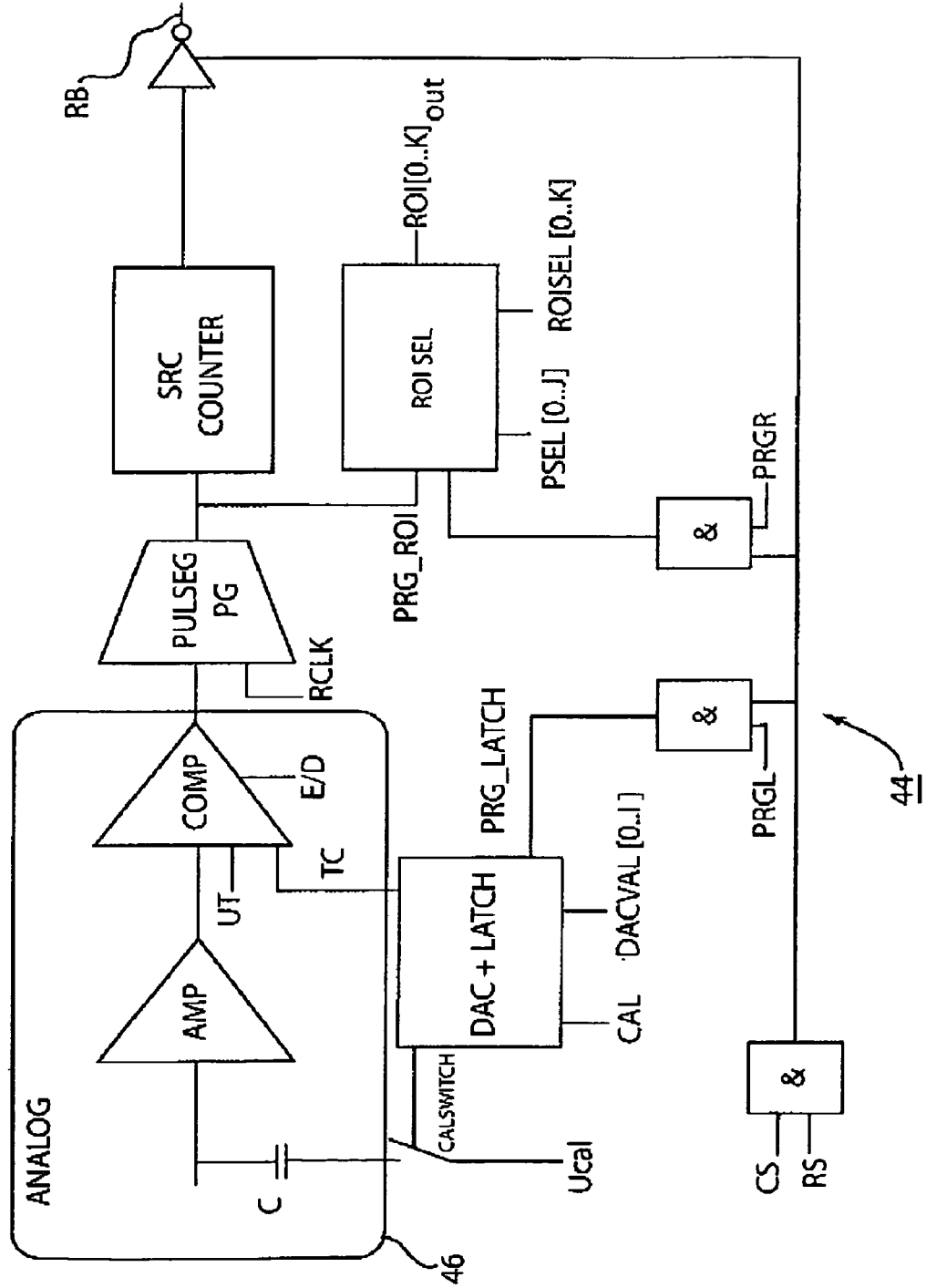

FIG. 1 a schematic view of a photodetector diode;

FIG. 2 a schematic view of a part of a sensor module comprising an array of photodetector diodes as one of them is shown in FIG. 1;

FIG. 3 a schematic view of a microstrip detector;

FIG. 4 a schematic view of the readout electronic of a readout unit cell assigned to and connected with a photodetector diode as shown in FIG. 1;

FIG. 5 a sensor module as a basic element for a photon-counting imaging device having a number of those sensor modules with a sensor module control board;

FIG. 6 a schematic view on a sensor module readout process;

FIG. 7 a schematic view on photons entering the microstrip detector according to FIG. 3;

FIG. 8 a schematic view of the signals caused by the photons as shown in FIG. 7 entering the microstrip detector; and FIG. 9 a detailed block diagram of an enhanced readout unit cell as shown in FIG. 4.

DETAILED DESCRIPTION OF THE INVENTION

FIG. 1 illustrates schematically the architecture of a photodetector diode 2 having a doped semiconductor $p^+$, $n^+$, $n^{++}$ trespassing section 4. The material chosen for the photodetector diode 2 depends on the desired bandgap energy required to generate an electron hole pair by the photo-effect. Suitable materials are undoped amorphous silicon having band gap of 1.12 eV and a bundle of IV-IV compounds and III-V compounds (indium and gallium salts, like gallium arsenide or indium antimonide).

An incident photon 6 having an energy in the range of several KeV before entering the doped semiconductor $p^+$, $n^+$, $n^{++}$ trespassing section 4 passes through an aluminum cover layer 8 and causes according to its energy and to the energy gap of the doped semiconductor $p^+$, $n^+$, $n^{++}$ trespassing section 4 a respective number of electron hole pairs 10 under x-ray annihilation. In the drawings, this number of electron hole pairs is exemplarily shown by one electron-hole pair 10 being divided by the electrical field generated by a source of bias potential 12. The evaluation of the charge occurred from the electron hole pairs 10 will be described below with reference to FIG. 4.

FIG. 2 shows a schematical view of a two-dimensional pixel detector 14 having a number of photodetector diodes 2 arranged in an array of 22 rows and 32 columns (compare FIG. 6). The photodetector diodes 2 have a length l and a width w of about 200 µm and a height of about 300 µm. Below the plane of these photodetector diodes 2 a readout chip 16 having a corresponding number of readout unit cells 18 is arranged for collecting the charge from the electron hole pairs 10 generated in the respective photodetector diodes 2. The electrical conjunction between a diode output interface 20 of the photodetector diodes 2 and an input interface 22 of the readout unit cells 18 is achieved by bump bonding using indium bumps 24.

FIG. 3 depicts a schematical view of a microstrip detector 26 having on a hybrid support 28 arranged a number of thirty-eight strip-type photodetector diodes 30 build in a microstrip sensor sector 32 of the hybrid support 28. The strip-type photodetector diodes 30 have a width of about 15 µm, a length of about 8 mm and a pitch of about 50 µm. Next to the microstrip sensor sector 32 a microstrip readout sector 34 is arranged having a number of readout unit cell 36 (not shown in detail, described below) corresponding to the number of strip-type photodetector diodes 30. These readout unit cells 36 are connected with their input interface 22 to the photodetector diodes 30 by bond pads 38 which additionally connect an output interface 40 of the readout unit cells 36 to a digital counting sector 42 which is described below, too. Due to the very limited width of the strip-type photodetector diodes 30 the spatial resolution achievable in one dimension is superior over the spatial resolution of the array-type two dimensional pixel detector 14.

FIG. 4 now depicts a schematic view of a electronic readout equipment 44 as it can be used for both the two-dimensional pixel detector 14 and the microstrip detector 26. The electronic readout equipment 44 is divided into an analog block 46 and a digital block 48. The analog block 46 starts with the bump pad 22 (interface), 38 resp. connected to an input terminal of a charge sensitive amplifier Amp. For calibration purposes, a source of calibration voltage $U_{Cal}$ is connected via a capacitor C to the input terminal of the amplifier Amp, too. The capacity of the capacitor has been chosen to a comparably tiny capacity of about only 1.7 fF allowing to be sensitive enough that the photo-electrons can change the voltage over the capacitor C to an extend that this difference can be significantly amplified by the amplifier Amp hereinafter referred to as first output voltage signal.

This first output voltage signal is led to one of the two input terminals of a comparator amplifier CA which is additionally connected to a source of a threshold voltage supply $U_T$. The other input terminal of the comparator amplifier CA is additionally connected to a source of threshold voltage correction supply TC. This source of threshold voltage correction supply TC allows to bias the input terminals of the comparator amplifier CA. According to the predetermined bias of the input terminals of the comparator amplifier CA even the first output voltage signal from the CS amplifier Amp that represents a fractional part of the charge of the generated photo-electron hole pairs only can be further processed and is therefore not lost for the successive data processing and evaluating.

This electronic readout equipment 44 enables the detection of fractions of the full charge of the photo-electron hole pairs 10 generated by an incident x-ray what may occur when the photo-electron hole pairs 10 are generated in the twilight zone located between two adjacent photodetector diodes 2 what will be described below with reference to the FIGS. 7 and 8.

As an example, the source of threshold voltage correction supply TC can be adjusted up to a level defined by one half of the full charge of the photo-electron hole pairs 10 generated in total by one x-ray photon. Consequentially, the distribution of the charge of the photo-electrons to adjacent photodetector diodes 2 can be further processed. A downstream data processing unit is now enabled to perform a differential evaluation of the digital output voltage signals of the comparators having its origin from the photo-electrons in adjacent photodetector diodes 2, whereby these photo-electrons have been generated by the same x-ray photon.

Downstream to the analog block 46 is the digital block 48 having generally the task to convert the digital output voltage signal into a digital counter signal that can be evaluated by multiplexing means MM provided with the data processing means DPM. Together with a enable/disenable switch E/D different clock means, i.e. an external clock RCLK from the data processing means DPM control a clock generator CG for a digital counter unit SRC which itself is connected to a readout bus output RBO. The digital data stored in the digital block 48 of a distinct readout unit cell can then be readout if a row select RS and column select CS are set high to set high an AND-gate &.

FIG. 5 illustrates a solid-state photon-counting imaging device 50 detecting the photon radiation over a comparably large flat area. The present architecture combine a number of sixteen pixel sensors 14 being arranged on a first substantially flat support plate 52 for building a sensor module 54, and a sensor module control board 56 being arranged on a second substantially flat support plate 58 hosting the electronic evaluation equipment, i.e. multiplexing means MM, data processing means DPM, which follow the afore-mentioned electronic readout equipment 44. The first substantially flat support plate 52 and the second substantially flat support plate 58 being arranged under an angle of 90°. This measure allows to construct a plane or curved detector surface area (here not shown in the drawings) made from a number of sensor modules 54 having the sensor module control boards 56 oriented to the opposite side of its detector surface.

FIG. 6 now shows a schematic view on a sensor module readout process indicating that appropriate multiplexing means MM allowing with a row select logic RS and a column select logic CS to address a predetermined readout unit cell 18 in order to readout the value of the digital counter SRC. This addressability lead to the capability of the complete photon-counting imaging device 50 to access and/or control continuously or temporarily each readout unit cell. The photon-counting imaging device 50 owns the capability to access and/or control via the data processing means DPM via the multiplexing means MM one or more of the following issues:

a) programming of the readout unit cell via a port DIN;
b) readout of the data in the readout unit cell via a port DOUT;
c) calibration of the readout unit cell, preferably the high gain voltage amplifier means 46, via a port CAL; and
d) analyzing the analog signal in the high gain voltage amplifier means 46 for the purpose of diagnosis via a port AOUT.

All the afore-mentioned ports DIN, DOUT, CAL and AOUT are comprised in the readout bus RB that is controlled by the data processing means DPM. With respect to the multiplexer means MM, it has to be pointed out additionally that this multiplexer means MM is substantially a separate chip being located on the sensor module control board 56. This separate chip generates a chip select for at least one or all of the readout chips assigned to each of the pixel sensors 14. Each readout chip itself comprises a column select shift register and a row select shift register for selecting a distinct sensor pixel. Therefore, in principal the multiplexing means MM are assigned to both each readout chip and the sensor module control board 56.

Additionally, FIG. 6 depicts a region of interest ROI consisting of nine photodetector diodes 2 what will be described below with FIG. 9 in detail.

FIGS. 7 and 8 are now used to introduce the afore-mentioned concept of charge sharing in the microstrip detector 26 allowing the enhancement of the position resolution for the incident photon 6 entering into the doped semiconductor $p^+$, $n^+$, $n^{++}$ trespassing section 4. Dotted lines shall indicate the electric field line of the bias potential 12 enabling to collect the photo-electrons at the anode of the photodetector diode 2 as schematically shown in FIG. 7. Two of the photodetector diodes 30 and their respective readout unit cells 36 are hereinafter referred to as a first channel Ch1 and a second channel Ch2.

In the drawings according to FIG. 8, the situation with respect to the potentials caused by the incident photons 6a, 6b and 6c is shown. The charge of the electron-hole pairs 10 generated by the photons 6b and 6c absorbed in the doped semiconductor $p^+$, $n^+$, $n^{++}$ trespassing section 4 in an intermediate region 60 between the two channels Ch1 and Ch2 is divided over these two channels Ch1 and Ch2 according to the position of the photons 6b and 6c. The charge is shared to the two channels Ch1 and Ch2 and both channels Ch1 and Ch2 show an analogue pulse at the output of the charge sensitive amplifier Amp as it can be seen from FIGS. 8b and 8c.

The pulses after the amplifier Amp (going into the comparator CA) for the photons 6a, 6b, 6c are shown in FIGS. 8a, 8b and 8c resp. Depending on setting of a threshold voltage $V_{Thresh}$ in the comparator CA, a certain risk occurs that the photons 6a, 6b and 6c are counted twice ($V_{thresh} < A_{max}/2$) or not at all ($V_{thresh} > A_{max}/2$). Both effects are highly undesirable and double counting is a serious problem for diffraction experiments.

It is therefore advantageous to implement in the data processing means DPM a logic that prohibits double counting for low threshold voltages ($V_{thresh} < A_{max}/2$). The logic to avoid double counting can easily be implemented using the fact that the output signal OS of the comparator CA for the pulse with the higher amplitude completely encloses the output signal of the comparator CA for the neighboring channel with the lower amplitude as this can been seen in FIG. 8b. FIG. 8b represents the distribution of the photoelectrons caused by the photon 6b that enters the intermediate region 60 a bit more on the side of the second channel Ch2. The pulse therefore generated in the second channel Ch2 exceeds the respective pulse in the first channel Ch1.

Therefore, the output signal OS of the comparator CA of the channel with the higher amplitude, here the second channel Ch2, can be used to disenable the adjacent channel, here the first channel Ch1, showing the lower signal amplitude. Double counting is therefore avoided by disenabling the weaker channel. I.e. using the output signal OS of the comparator CA of a dominating channel to disenable the comparator CA via the Enable/Disenable Switch E/D (or the counting) of its two neighboring channels provided the coincidently occurring amplitude of the central channel is above the threshold.

The effect of the charge sharing over two adjacent channels can also be used advantageously to improve the position resolution above the position resolution given by the patterning of the photodetector diodes 30. For example, this can be done by introducing intermediate channels in the readout electronics which either have a special analogue part summing the analogue signals from the two neighbors for restoring the full charge of the electron hole pairs caused by photons entering the intermediate region, or by avoiding completely the analogue part for the intermediate channel, to design a virtual intermediate channel that only counts in case both the comparators CA of both neighbors give a coincident pulse that reaches in total substantially the level of the full charge of a photon completely absorbed in one channel. In the case of analogue summing a scheme like the one given above can be used to avoid double counting.

In the latter case either additional logic has to be implemented to avoid counting of the neighbors or, even easier, since the intermediate channel only counts if both neighbors count, the counter value of the intermediate channel can just be subtracted from both neighbors. This can be done off line. For the enhancement of the resolution the threshold voltage $V_{Thresh}$ has to be in the range $0 < V_{thresh} < A_{max}/2$, preferably closer to $A_{max}/2$ than to zero.

FIG. 9 now in detail illustrates the design of the electronic equipment 44 of the readout unit cells 18, 36. Again the analog part 46 is shown comprising the low noise, high gain amplifier Amp and the comparator COMP. The analog part 46 is thereby shown in a shaded manner. Any other component shown in this FIG. 9 contributes to the digital part 48. Additionally to the schematic view according the FIG. 4, the controlling of the analog part 46 is represented by a Calibration and threshold correction unit DAC+LATCH which on the one hand side controls a calibration switch CALSWITCH and on the other hand side sets the voltage level for the supply of threshold voltage correction TC. The calibration and threshold correction unit DAC+LATCH is addressed by both setting the AND-gate for the column select CS and the row select RS and the AND-gate for latch programming PRGL to "High" (logically to "1").

Within the normal counting operation, the output signal OS is processed with the pulse generator and the counter SRC. With respect to the selection of a specific region of interest ROI as shown in FIG. 6, the signal after the pulse generator PG is processed to a region of interest unit ROI SEL that can be programmed by a port PRG_ROI. The region of interest unit ROI SEL so far administrates the incoming signal from the pulse generator PG and assigns these signals to the predefined region of interest ROI. By the way, it should be mentioned that a number of different regions of interests ROI(0, . . . , K) can be predetermined although only one region of interest is shown in FIG. 6. The assignment is made by setting an output signal to the respective region of interest output interface ROI(0, . . . , K)$_{out}$ which is connected to the data processing means DPM. The occurrence of this output signal is accompanied by a time stamp which is stored to the data processing means DPM with reference to the respective region of interest ROI. In this manner, the time stamps represent the occurrence of the incident photons 6 in the preselected region of interest ROI. Therefore, a significant higher time resolution for the arrival time of the photons hitting the pixel detector 14 or the microstrip detector 26 in the region of interest ROI. For generating the time stamps, a clock can be used realized as a counter pulsed with a specific frequency, e.g. 100 MHz for a desired time resolution of 10 ns. The clock can be reset at the beginning of the experiment to define the time $t_0=0$.

As it can be seen from FIG. 6, the region of interest ROI consist of an 3×3 array of photodetector diodes 2. It should be mentioned that, alternatively, a region of interest may be even larger or even smaller up to only one photodetector diode 2.

LIST OF REFERENCE NUMBER

2 Photodetector diode
4 Doped semiconductor p$^+$, n$^+$, n$^{++}$ trespassing section
6 Photon
6a, 6b, 6c Photons
8 Aluminum cover layer
10 Electron hole pairs
12 Source of bias potential
14 Pixel detector
16 Readout chip
18 Readout unit cells
20 Diode output interface
22 Input interface
24 Indium bumps
26 Microstrip detector
28 Hybrid support
30 Strip-type photodetector diodes
32 Microstrip sensor sector
34 Microstrip readout sector
36 Readout unit cells
38 Bond pads
40 Output interface
42 Digital counter section
44 Electronic readout equipment
46 Analog block
48 Digital block
50 Solid-state photon-counting imaging device
52 First substantially flat support plate
54 Sensor module
56 Sensor module control board
58 Second substantially flat support plate
60 Intermediate region
$A_{max}$ Average amplitude
Amp Charge sensitive Amplifier
C Capacitor
CA, COMP Comparator amplifier
CAL Calibration voltage
CALSWITCH Switch for calibration voltage
CG Clock generator
Ch1, Ch2 First channel resp. second channel of two adjacent readout unit cells
CS Column select
DAC+LATCH Calibration and threshold correction unit
E/D Enable/Disenable Switch
MM Multiplexing Means
OS Output signal
PG Pulse generator
PRGL Port for programming the DAC+LATCH
PRG_ROI Port for programming the ROI SEL
RB Readout bus
Reset Digital counter reset
ROI Region of interest
ROI SEL Region of interest unit
ROI(0, . . . , K)$_{out}$ Region of interest output interface
RS Row select
SRC Digital counter unit
t Time
TC Source for threshold voltage correction supply
$U_{Cal}$ Source for calibration voltage
$U_T$ Source for threshold voltage supply
$V_{Thresh}$ Threshold voltage

What is claimed is:

1. A photon-counting imaging device for single xray counting comprising:
   a) a layer of photosensitive material;
   b) a source of bias potential;
   c) a source of a threshold voltage supply;
   d) an N×M array of photodetector diodes formed using said layer of photosensitive material, each of said photodetector diodes having a bias potential interface and a diode output interface, said bias potential interface of each photodetector diode being connected to said bias potential;
   e) an NXM array of high gain, low noise readout unit cells, one readout unit cell for each photodetector diode;
   f) each readout unit cell including:
      an input interface connected to said diode output interface;
      a high-gain voltage amplifying unit including a comparator unit; and
      a digital counter unit including a digital counter and a digital counter output interface connected in series, each digital counter unit counting an output signal of the comparator unit, said output signal being proportional to a number of electron/hole pairs generated by a photon in the respective photodetector diode;
   g) a multiplexing unit including a row select and a column select circuit allowing to access each readout cell unit, to read out the digital data as actually stored in the digital counter to the digital counter output interface:
   h) each digital counter output interface connected to an output bus; and
   i) said output bus being connected to a data processing unit controlling the multiplexing unit.

2. The photon-counting imaging device according to claim 1, wherein the diode output interface of the photodetector diodes and the input interface of the readout unit cell are connected to each other by bump bonding.

3. The photon-counting imaging device according to claim 2, wherein indium bumps are used for the bump bonding.

4. The photon-counting imaging device according to claim 1, wherein the data processing unit are provided being connected via the multiplexer unit to said array of readout unit cells allowing to control each of the readout unit cells.

5. The photon-counting imaging device according to claim 4, wherein said data processing unit controls a enable/disenable switch being comprised in the comparator unit of said high gain voltage amplifying unit.

6. The photon-counting imaging device according to claim 1, wherein said source of a threshold voltage supply to said high gain voltage amplifying unit comprises an adjustable source of threshold voltage correction supply, both being controlled by the data processing unit via the multiplexer unit.

7. The photon-counting imaging device according to claim 1, wherein the data processing unit controls, via the multiplexing unit, one or more of the following issues:
 1) programming of the readout unit cell via a port;
 2) readout of the data in the readout unit cell via a port;
 3) calibration of the readout unit cell, preferably the high gain voltage amplifier unit, via a port; and
 4) analyzing the analog signal in the high gain voltage amplifier unit for the purpose of diagnosis via a port.

8. The photon-counting imaging device according to claim 1, wherein said N×M array of photodetector diodes, said N×M array of said readout unit cells being arranged on a first substantially flat support plate for building a sensor module, and a sensor module control board being arranged on a second substantially flat support plate, said first substantially flat support plate and said second substantially flat support plate being arranged under an angle to each other.

9. The photon-counting imaging device according to claim 8, wherein said angle is in a range of 30 to 120.

10. The photon-counting imaging device according to claim 9, wherein a number of said sensor modules being arranged in a substantially flat V×W array.

11. A photon-counting imaging device for single xray counting comprising;
 a) a layer of photosensitive material;
 b) a source of bias potential;
 c) a source of a threshold voltage supply;
 d) an N×H array of photodetector diodes formed using said layer of photosensitive material, each of said photodetector diodes having a bias potential interface and a diode output interface, said bias potential interface of each photodetector diode being connected to said bias potential;
 e) an N×M array of high gain, low noise readout unit cells, one readout unit cell for each photodetector diode being controlled by a data processing unit;
 f) each readout unit cell including:
  an input interface connected to said diode output interface;
  a high-gain voltage amplifying unit including a comparator unit;
  a digital counter unit, including a digital counter and a digital counter output interface connected in series, each digital counter unit counting an output signal of the comparator unit, said output signal being proportional to a number of electron hole pairs generated by a photon in the respective photodetector diode; and
 g) the array of photodetector diodes is designed as a microstrip detector having N=1 columns and $10 < M < 10^5$ rows.

12. The photon-counting imaging device according to claim 11, wherein said rows having a width of about 5 to 50 µm, a length of about 0.5 to 50 µm, and a pitch of about 10 to 100 µm.

13. The photon-counting imaging device according to claim 12, wherein said rows have a width of about 10 to 20 µm, a length of about 5 to 10 µm, and a pitch of about 25 to 75 µm.

14. The photon-counting imaging device according to claim 11, wherein said source of a threshold voltage supply to said high gain voltage amplifying unit comprises an adjustable source of threshold voltage correction supply, both being controlled by the data processing unit.

15. The photon-counting imaging device according to claim 11, wherein said data processing unit provide unit for enhancing the position resolution of an incident photon, said unit for enhancing the position resolution comprising a comparator unit comparing the signals of two adjacent photodetector diodes.

16. The photon-counting imaging device according to claim 11, wherein the data processing unit allow to determine an average amplitude for the gain of the electron hole pairs generated by an incident photon and to set a threshold voltage corresponding to less than half of the average amplitude, said data processing unit evaluate coincident output signals in adjacent readout unit cells in order to disenable the counting in the adjacent readout unit cells having delivered the lower output signals.

17. The photon counting imaging device according to claim 11, wherein the data processing unit allow to determine an average amplitude for the gain of the electron hole pairs generated by an incident x-ray photon and to set a threshold voltage corresponding to less than half of the average amplitude, the data processing unit generate a virtual intermediate photodetector diode between two adjacent photodetector diodes; and an incident photon is assigned to said virtual intermediate photodetector diode in case the output signals in two readout unit cells assigned to adjacent photodetector diodes exceed said threshold voltage.

18. The photon-counting imaging device according to claim 11, wherein the data processing unit controls one or more of the following issues:
 1) programming of the readout unit cell via a port;
 2) readout of the data in the readout unit cell via a port;
 3) calibration of the readout unit cell, preferably the high gain voltage amplifier unit, via a port1 and
 4) analyzing the analog signal in the high gain voltage amplifier unit for the purpose of diagnosis via a port.

19. A photon counting imaging device for single x-ray counting comprising:
 a) a layer of photosensitive material;
 b) an N×M array of photodetector diodes formed using said layer of said photosensitive material;
 c) an N×M array of high gain, low noise readout unit cells, one readout unit cell for each photodetector diode, the readout unit cells being controlled by a data processing unit;
 d) each readout unit cell including an internal data processing unit allowing to assign each output signal representing an incident photon or a predetermined number of incident photons in the corresponding photodetector diode to a preselectable region of interest; and
 e) said assignment of the output signal is accompanied by a time stamp.

20. The photon counting imaging device according to claim 19, wherein each readout unit cell further comprises an input interface connected to said diode output interface, a high-gain voltage amplifying unit including a comparator unit, a digital counter unit, including a digital counter, and a digital counter output interface connected in series, each digital counter unit counting the output signal of the comparator unit, and said output signal is additionally directed to a region of interest unit, said region of interest unit being part of the readout unit cell or being part of the external data processing unit.

21. The photon-counting imaging device according to claim 19, wherein at least one predeterminable region of interest is comprised, whereby a preselectable number of elected photodetector diodes build this region of interest; the output signal in each elected corresponding readout cell unit being processed to a region of interest unit causing the output interface, corresponding to the region of interest hit by an incident photon to set a region of interest hit signal, said region of interest hit signal is aligned by the time stamp originated by an external or an internal clock unit.

22. The photon-counting imaging device according to claim 21, wherein the data processing unit provides a unit for storing either the time stamp or information including the time stamp and the corresponding regions of interest which was hit by an incident photon originally causing the output signal.

23. The photon-counting imaging device according to claim 21, wherein the region of interest unit comprises a counter unit for which a threshold for setting a region of interest hit signal is determinable.

24. The photon-counting imaging device according to claim 21, wherein the external or the internal clock unit are resetable and operates with a frequency in the range of 10 to 500 MHz.

25. The photon-counting imaging device according to claim 24, wherein the range is about 100 MHz.

26. The photon-counting imaging device according to claim 19, wherein a number of at least two regions of interest are provided, each of the at least two regions of interest having a programmable timerelated validity.

* * * * *